(12) United States Patent
Imamura et al.

(10) Patent No.: US 10,490,415 B2
(45) Date of Patent: Nov. 26, 2019

(54) METHOD OF MANUFACTURING 3-DIMENSIONAL MEMORIES INCLUDING HIGH ASPECT RATIO MEMORY HOLE PATTERNS

(71) Applicant: TOSHIBA MEMORY CORPORATION, Tokyo (JP)

(72) Inventors: Tsubasa Imamura, Kuwana Mie (JP); Atsushi Takahashi, Yokkaichi Mie (JP); Toshiyuki Sasaki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/253,816

(22) Filed: Aug. 31, 2016

(65) Prior Publication Data

US 2017/0263611 A1    Sep. 14, 2017

(30) Foreign Application Priority Data

Mar. 10, 2016   (JP) ................................. 2016-047262

(51) Int. Cl.
   *H01L 21/311*   (2006.01)
   *H01L 27/11582*   (2017.01)
(52) U.S. Cl.
   CPC .. *H01L 21/31144* (2013.01); *H01L 21/31138* (2013.01); *H01L 27/11582* (2013.01)
(58) Field of Classification Search
   CPC ............ H01L 27/115; H01L 21/31144; H01L 21/02274; H01L 21/31138; H01L 21/02118
   See application file for complete search history.

(56) References Cited

U.S. PATENT DOCUMENTS

| 7,758,761 | B2 * | 7/2010 | Nakagawa ............. G02B 6/136 |
| | | | 216/58 |
| 8,859,167 | B2 | 10/2014 | Hagio et al. |
| 2009/0047789 | A1 | 2/2009 | Jung |
| 2009/0286402 | A1 | 11/2009 | Xia et al. |

(Continued)

FOREIGN PATENT DOCUMENTS

| JP | H03-072087 A | 3/1991 |
| JP | H09-050984 A | 2/1997 |

(Continued)

OTHER PUBLICATIONS

Notification of Reasons for Refusal dated Nov. 30, 2018 in corresponding Japanese Patent Application No. 2016-047262 with English translation, 10 pages.

*Primary Examiner* — William F Kraig
*Assistant Examiner* — Vicki B. Booker
(74) *Attorney, Agent, or Firm* — Kim & Stewart LLP

(57) ABSTRACT

According to one embodiment, a method of manufacturing a semiconductor device includes forming a first film on a substrate. The method further includes forming a second film on the first film. The method further includes simultaneously flowing a first gas with a second gas containing a metal element to form a first opening in the second film and forming a third film containing the metal element on a side surface of the first opening. The method further includes forming a second opening in the first film below the first opening using the second film as a mask.

8 Claims, 20 Drawing Sheets

(56) References Cited

U.S. PATENT DOCUMENTS

| | | |
|---|---|---|
| 2012/0115250 A1 | 5/2012 | Ariga et al. |
| 2012/0184078 A1 | 7/2012 | Kiyotoshi |
| 2016/0111432 A1* | 4/2016 | Rabkin .............. G11C 16/0483 |
| | | 257/314 |

FOREIGN PATENT DOCUMENTS

| | | |
|---|---|---|
| JP | 2010-171372 | 8/2010 |
| JP | 4629086 | 2/2011 |
| JP | 2011-521452 A | 7/2011 |
| JP | 2012-145334 | 8/2012 |
| JP | 2012-151187 A | 8/2012 |
| JP | 2018-048180 | 3/2014 |
| WO | 2010/134176 A1 | 11/2010 |

* cited by examiner

METHOD OF MANUFACTURING 3-DIMENSIONAL MEMORIES INCLUDING HIGH ASPECT RATIO MEMORY HOLE PATTERNS

CROSS-REFERENCE TO RELATED APPLICATION

This application is based upon and claims the benefit of priority from Japanese Patent Application No. 2016-047262, filed Mar. 10, 2016, the entire contents of which are incorporated herein by reference.

FIELD

Embodiments described herein relate generally to a method of manufacturing a semiconductor device.

BACKGROUND

To manufacture 3-dimensional memories, processing layers, including a plurality of sacrificial layers and a plurality of insulation layers, are formed that alternate with each other, and memory holes are formed in the processing layers. Memory elements are formed in the memory holes and the sacrificial layers are subsequently substituted with electrode layers. However, when an aspect ratio of the memory hole increases, an aspect ratio of a hole pattern of a mask layer for processing the processing layer also generally increases. In this case, when the hole pattern is formed, there is a problem that a side surface of the hole pattern is eroded by etching. When the side surface is eroded, there is a possibility that adjacent hole patterns may become connected. The same problem may also occur when openings are formed in various films.

DETAILED DESCRIPTION

Embodiments provide a method of manufacturing a semiconductor device capable of suppressing a recess or erosion on a side surface of an opening when the opening is formed in a film.

In general, according to one embodiment, a method of manufacturing a semiconductor device includes forming a first film on a substrate. The method further includes forming a second film on the first film. The method further includes simultaneously flowing a first gas with a second gas containing a metal element to form a first opening in the second film and forming a third film containing the metal element on a side surface of the first opening. The method further includes forming a second opening in the first film below the first opening using the second film as a mask.

Hereinafter, exemplary embodiments will be described with reference to the drawings.

First Embodiment

Figure 1A:
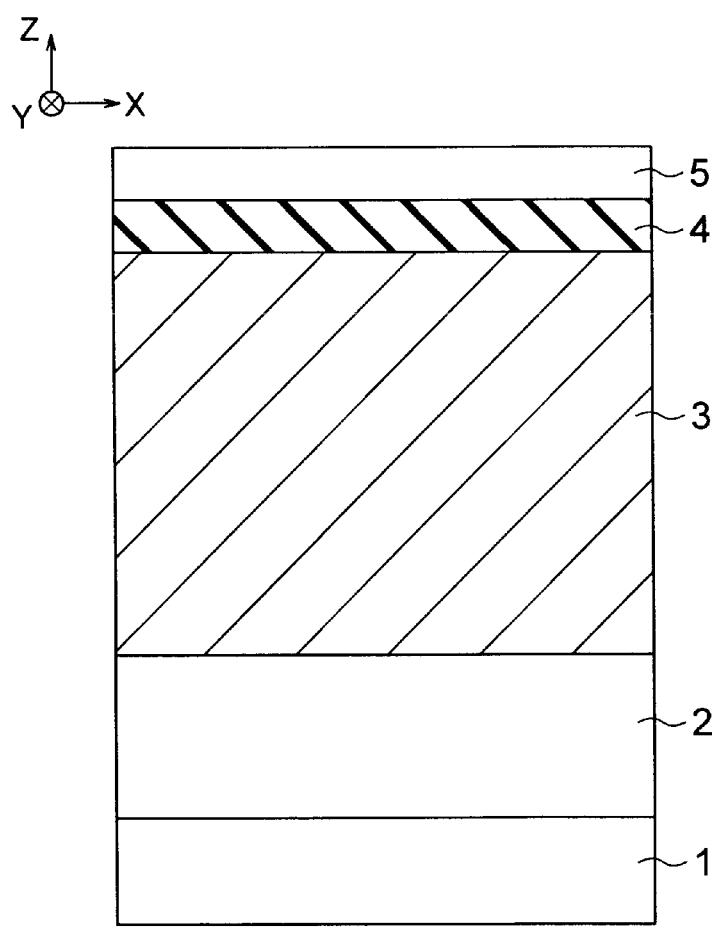
FIGS. 1A and 1B are sectional views illustrating a method of manufacturing a semiconductor device according to a first embodiment.
Figure 2A:
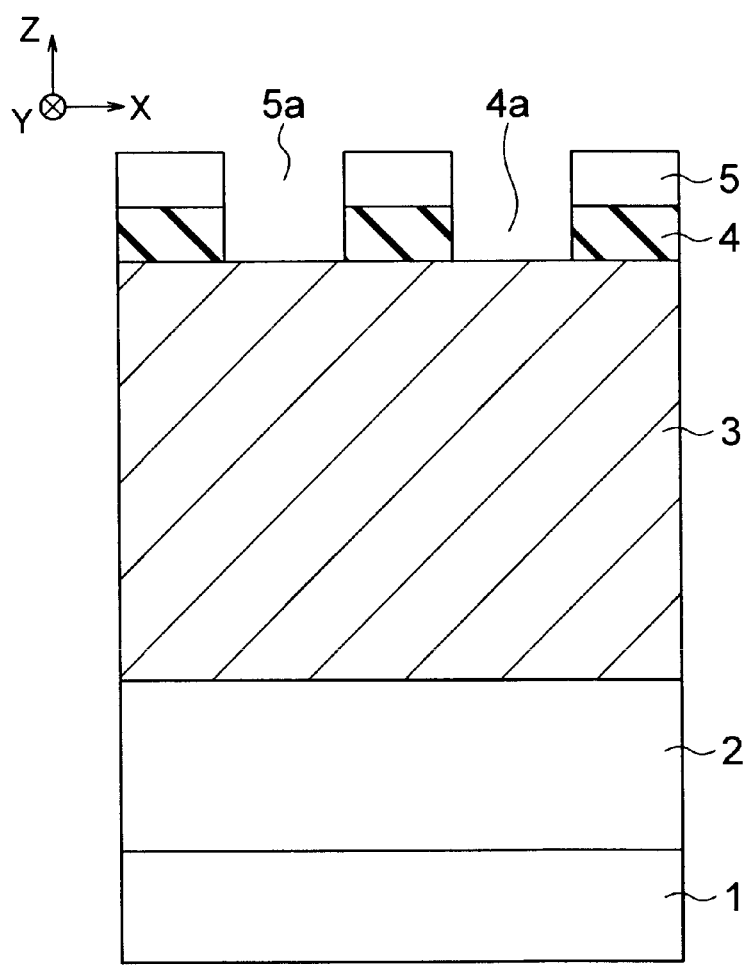
FIGS. 2A and 2B are sectional views illustrating the method of manufacturing the semiconductor device according to the first embodiment.
Figure 2B:
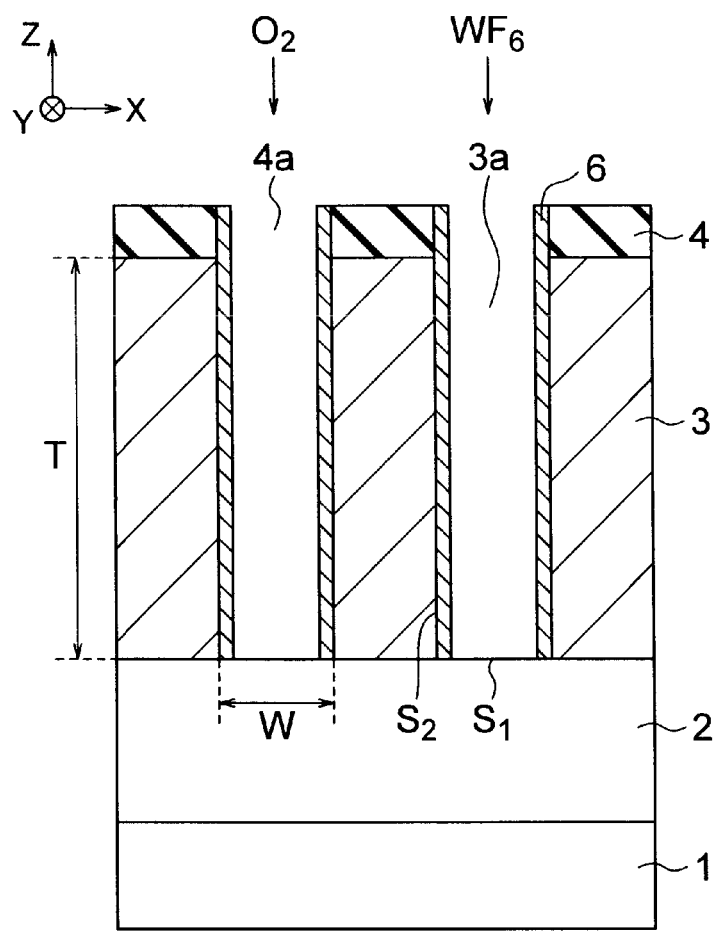

FIGS. 1A and 2B are sectional views illustrating a method of manufacturing a semiconductor device according to a first embodiment.

First, a processing layer 2, a first mask layer 3, a second mask layer 4, and a resist layer 5 are sequentially formed on a substrate 1 (see FIG. 1A). The processing layer 2 is an example of a first film. The first mask layer 3 is an example of a second film.

An example of the substrate 1 is a semiconductor substrate such as a silicon substrate. In FIG. 1A, X and Y directions orthogonal to each other in parallel to the surface defined by the interface between the substrate 1 and the processing layer 2 and a Z direction orthogonal to the X-Y surface of the substrate 1 are illustrated. In the present specification, the +Z direction is referred to as an upward direction and the −Z direction is referred to as a downward direction. In the embodiment, the −Z direction may be identical to the direction of gravity or may not be identical to the direction of gravity.

Examples of the processing layer 2 are various conductive layers, semiconductor layers, and insulation layers. The processing layer 2 may be formed directly on the substrate 1, or may be formed on the substrate 1 with another layer-interposed therebetween. The processing layer 2 according to the embodiment includes a plurality of sacrificial layers (for example, silicon nitride films) alternating with a plurality of insulation layers (for example, silicon oxide films), as will be described below.

An example of the first mask layer 3 is an organic film such as a carbon film. The first mask layer 3 according to the embodiment is formed by plasma chemical vapor deposition (CVD).

An example of the second mask layer 4 is an inorganic film such as a silicon oxide film. The second mask layer 4 according to the embodiment is formed by plasma CVD.

The resist layer 5 is formed of, for example, a resist material for a light source, such as argon fluoride (ArF). The resist layer 5 according to the embodiment is formed by spin coating.

Figure 1B:
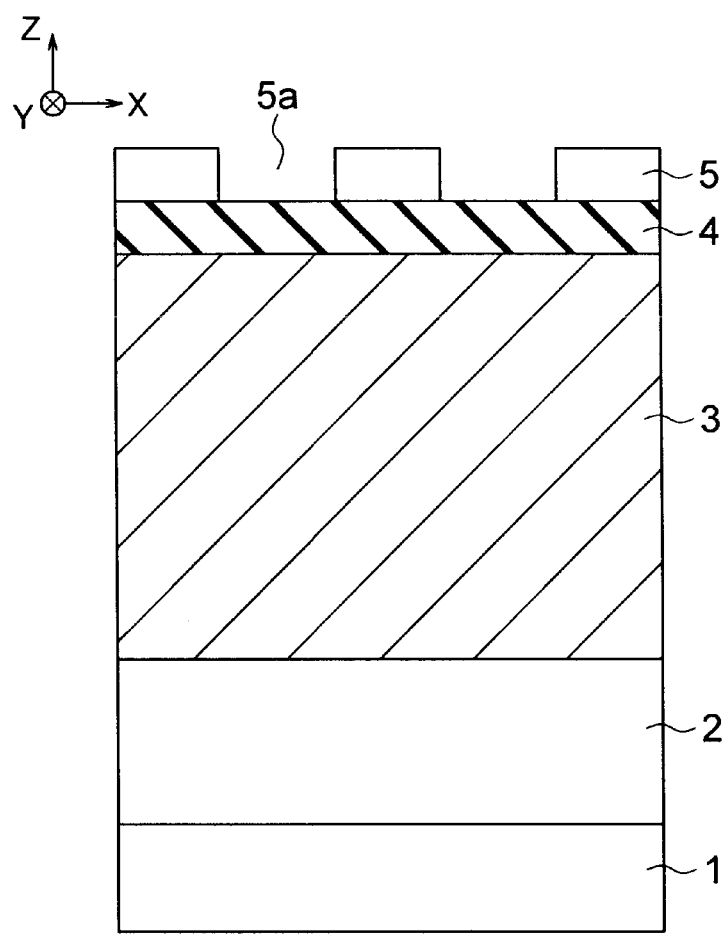

Next, the resist layer 5 is patterned by lithography (see FIG. 1B). As a result, openings (hole patterns) 5a are formed in the resist layer 5.

Next, the second mask layer 4 is processed by reactive ion etching (RIE) using the resist layer 5 as a mask (see FIG. 2A). As a result, the openings 5a of the resist layer 5 are transferred to the second mask layer 4, and openings (hole patterns) 4a are formed in the second mask layer 4. The RIE process is performed, for example, using plasma of a fluorocarbon gas.

Next, the first mask layer 3 is processed by the RIE process using the second mask layer 4 as a mask (see FIG. 2B). As a result, the openings 4a of the second mask layer 4 are transferred to the first mask layer 3, and thus openings (hole patterns) 3a are formed in the first mask layer 3. Reference sign $S_1$ denotes a bottom surface of the opening 3a. Reference sign $S_2$ denotes a side surface of the opening 3a. The openings 3a according to the embodiment are formed to penetrate through the first mask layer 3. Reference sign W denotes the width of the opening 3a. Reference sign T denotes the depth of the opening 3a (the thickness of the first mask layer 3). An aspect ratio T/W of the opening 3a according to the embodiment is equal to or greater than 20 (for example, 20 to 30). The opening 3a is an example of a first opening.

The RIE in FIG. 2B is performed simultaneously using a first gas used to process the first mask layer 3 and a second gas containing a metal element. Specifically, the RIE process is performed in an RIE apparatus using plasma of a mixture gas of the first and second gases. An example of the first gas is an oxygen ($O_2$) gas. An example of the second gas is a tungsten hexafluoride ($WF_6$) gas.

In FIG. 2B, the first mask layer 3 is etched by the $O_2$ gas to form the openings 3a. Metal films 6 are formed on the side surfaces of the openings 3a and 4a by the $WF_6$ gas. The metal films 6 according to the embodiment are tungsten (W) films and contain the tungsten element originated from the $WF_6$ gas.

In FIG. 2B, the processing of the first mask layer 3 by the first gas and the forming of the metal film 6 by the second gas are simultaneously performed. Accordingly, when the opening 3a is formed, the metal film 6 can suppress etching, erosion, and recessing of the side surface $S_2$ of the opening 3a.

The first gas may be a gas other than the $O_2$ gas. Examples of the first gas include a hydrogen ($H_2$) gas, a nitrogen ($N_2$) gas, a carbonyl sulfide (COS) gas, a carbon monoxide (CO) gas, a carbon dioxide ($CO_2$) gas, a methane ($CH_4$) gas, or mixture gases thereof. For example, the $H_2$ gas or the $N_2$ gas can be used to etch the first mask layer 3, similarly to the $O_2$ gas. The $CH_4$ gas or the COS gas can be used to attach carbon to the side surface $S_2$ during the etching of the first mask layer 3 to further reduce lateral etching and erosion of the side surface $S_2$ of the first mask layer 3.

The second gas may be a gas other than the $WF_6$ gas. Examples of the second gas include a molybdenum hexafluoride ($MoF_6$) gas, a rhenium hexafluoride ($ReF_6$) gas, a platinum hexafluoride ($PtF_6$) gas, an iridium hexafluoride ($IrF_6$) gas, a titanium tetrachloride ($TiCl_4$) gas, a ruthenium tetroxide ($RuO_4$) gas, a trimethylaluminum (($CH_3)_3Al$) gas, or mixture thereof. In this case, the metal film 6 is, respectively, a molybdenum (Mo) film, a rhenium (Re) film, a platinum (Pt) film, an iridium (Ir) film, a titanium (Ti) film, a ruthenium (Ru) film, an aluminum (Al) film, or the like.

A flow rate of the second gas is preferably kept low. IF the flow rate of the second gas is too great, the metal film 6 can deposit on the bottom surface $S_1$ of the opening 3a. When a thick metal film 6 is attached to the bottom surface $S_1$ before the formation of the opening 3a, the etching of the first mask layer 3 is obstructed due to the presence of the metal film 6, and thus the etching may stop. Accordingly, in the embodiment, the flow rate of the second gas is set to be equal to or less than 10 sccm (for example, 5 sccm).

The problem of the metal film 6 attaching to the bottom surface $S_1$ arises when a ratio of the flow rate of the second gas to a total flow rate of the first and second gases is too high. Accordingly, in the embodiment, this ratio is set to be equal to or less than 5% (for example, 2.5%).

Figure 3:
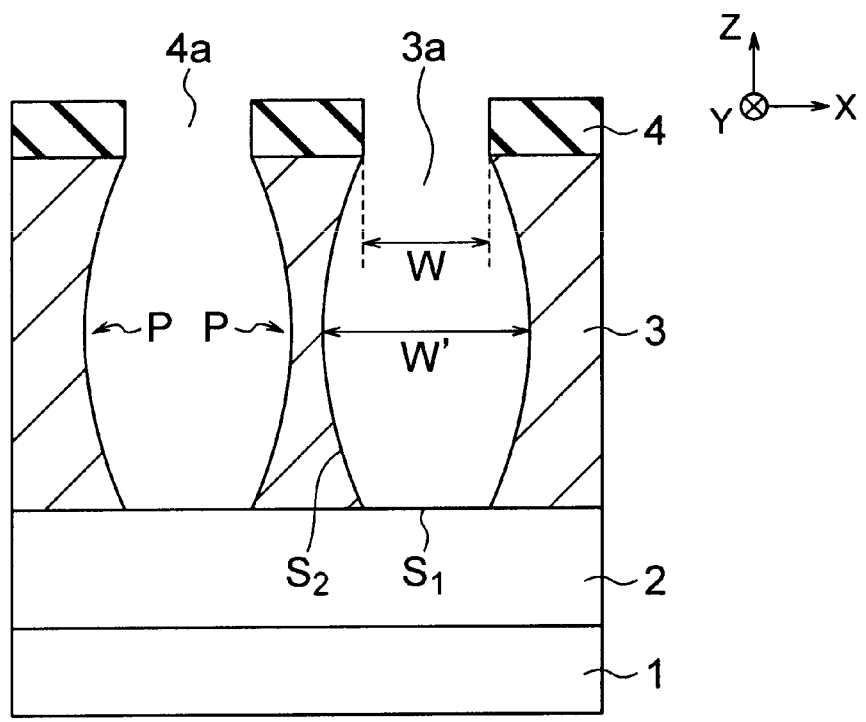
FIG. 3 is a sectional view illustrating a method of manufacturing a semiconductor device according to a comparative example to the first embodiment.

FIG. 3 is a sectional view illustrating a method of manufacturing a semiconductor device according to a comparative example of the first embodiment.

FIG. 3 illustrates a case in which the RIE process of FIG. 2B is performed using only the first gas. In this case, when the openings 3a are formed, the side surfaces $S_2$ of the openings 3a are largely recessed or eroded due to the etching. Reference sign W denotes the width of the upper end of the opening 3a. Reference sign W' denotes the width of a largest portion P of the opening 3a. In the comparative example, a difference between the widths W and W' may increase. In contrast, according to the embodiment, the difference between the widths W and W' is lessened.

Figure 4:
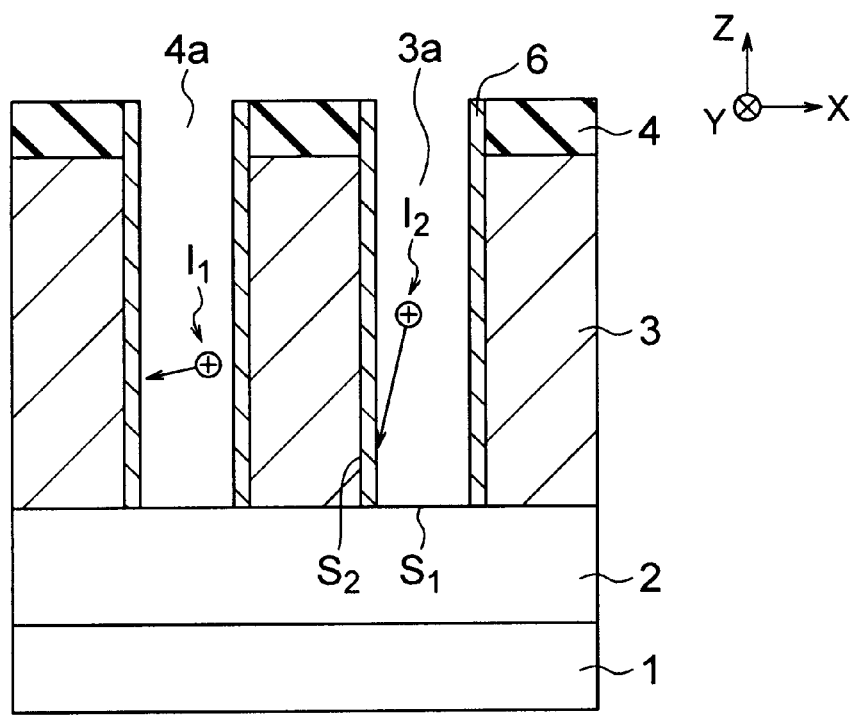
FIG. 4 is a sectional view illustrating a metal film according to the first embodiment.

FIG. 4 is a sectional view illustrating the metal film 6 according to the first embodiment.

FIG. 4 illustrates the RIE of FIG. 2B. Reference sign $I_1$ denotes an etching ion incident on the metal film 6 that is substantially perpendicular to a plane of the metal film 6 at the time of the RIE. Reference sign $I_2$ denotes an etching ion incident in a substantially parallel orientation with the plane of the metal film 6 at the time of the RIE.

The metal film 6 according to the embodiment preferably has great resistance to the RIE. When the resistance to the RIE is lessened, there may be a high possibility of the metal film 6 being broken during the RIE of the device of FIG. 2B and the side surface $S_2$ may not be sufficiently protected. At the time of the RIE of FIG. 2B, many ions, such as reference sign $I_2$, are incident on the metal film 6. Accordingly, the resistance of the metal film 6 at that time depends on an etching rate by ions such as reference sign $I_2$. Therefore, the metal film 6 is selected such that an etch rate of the etching ions incident in a substantially parallel orientation with the metal film 6 is low. An example of the above-described second gas is a gas capable of forming the metal film 6 for which the etching rate is low.

Instead of the metal film 6, a silicon oxide film or a silicon nitride film has been considered to be formed on the side surface $S_2$ of the opening 3a. However, the silicon oxide film or the silicon nitride film is easily broken during the RIE process and an etching rate by ions such as reference sign $I_2$ is high. Accordingly, in the embodiment, the metal film 6 is formed on the side surface $S_2$ of the opening 3a using the second gas as described herein.

FIGS. 5A to 6B are sectional views illustrating the details of the method of manufacturing the semiconductor device according to the first embodiment.

Figure 5A:
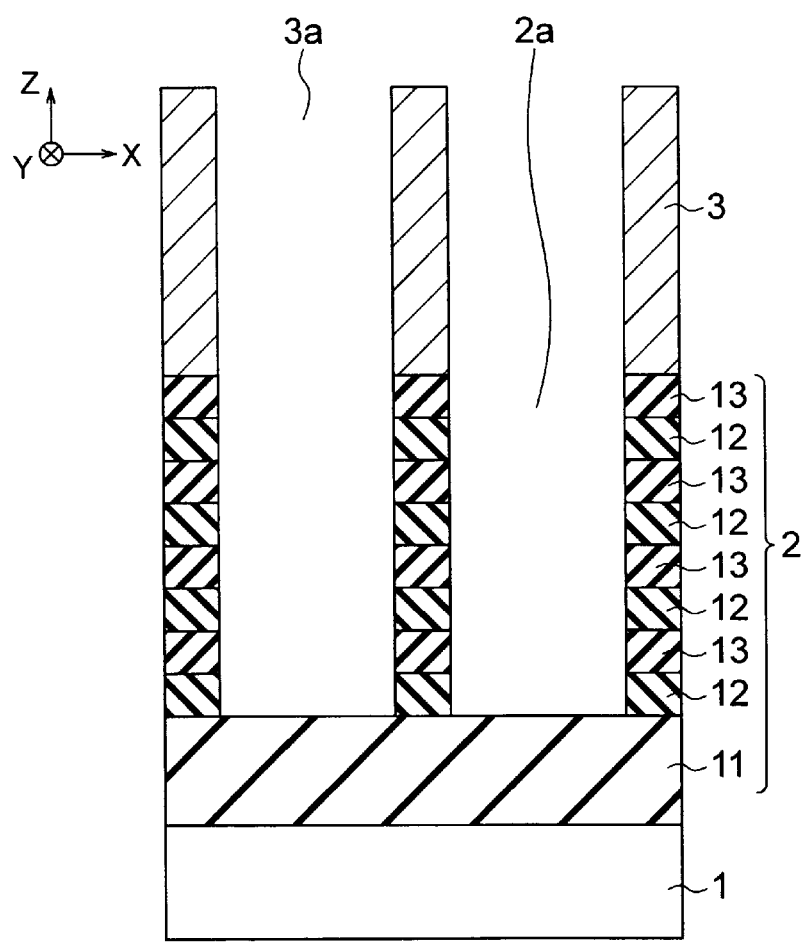
FIGS. 5A and 5B are sectional views illustrating the details of the method of manufacturing the semiconductor device according to the first embodiment.

FIG. 5A illustrates a process after the RIE process of FIG. 2B. As illustrated in FIG. 5A, the processing layer 2 includes an inter-layer insulation film 11, and a plurality of sacrificial layers 12 alternating with a plurality of insulation films 13 formed on the inter-layer insulation film 11. The inter-layer insulation film 11 is, for example, a silicon oxide film. The sacrificial layer 12 is, for example, a silicon nitride film. The insulation layer 13 is, for example, a silicon oxide film. The processing layer 2 may further include inter-layer insulation films formed on the sacrificial layers 12 and the insulation layers 13. The sacrificial layer 12 is an example of a first layer. The insulation layer 13 is an example of a second layer.

In FIG. 5A, the processing layer 2 is processed through the RIE using the first mask layer 3 as a mask. As a result, the openings 3a of the first mask layer 3 are transferred to the processing layer 2 to form openings (memory holes) 2a in the processing layer 2. The opening 2a according to the embodiment is formed to penetrate through the sacrificial layers 12 and the insulation layers 13 to reach the inter-layer insulation film 11. The opening 2a is an example of a second opening.

In the embodiment, the metal film 6 is removed before the process of FIG. 5A as described below, but the process of FIG. 5A may be performed without removing the metal film 6.

Figure 5B:
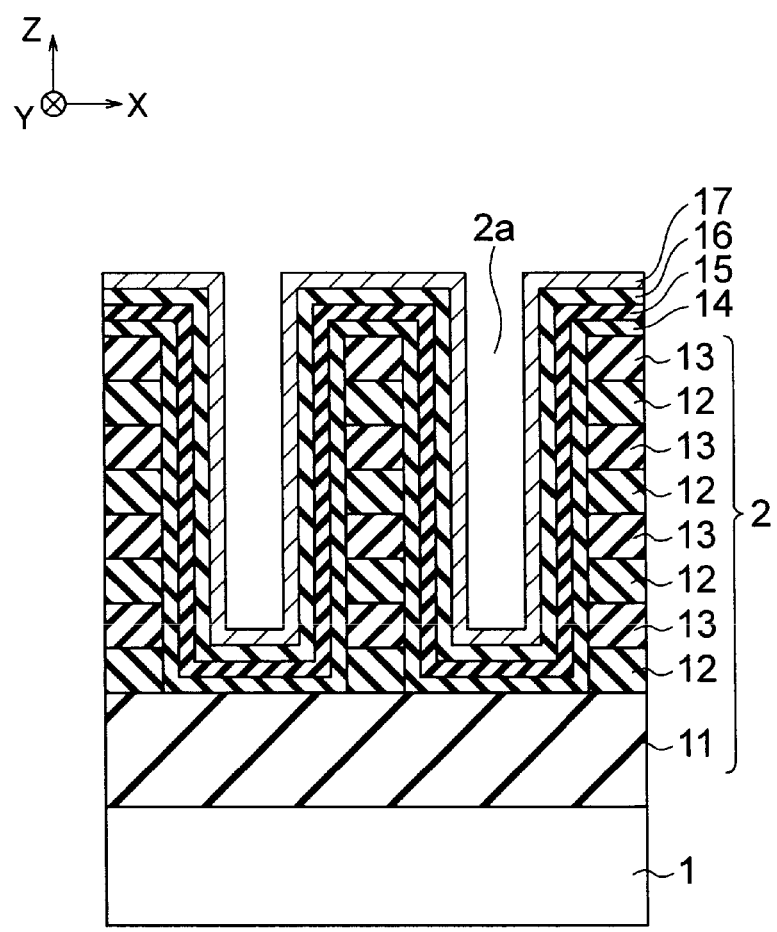

Next, as shown in FIG. 5B, a first insulation film 14, a charge storage layer 15, a second insulation film 16, and a first semiconductor layer 17 are sequentially formed on the side surfaces and the bottom surfaces of the openings 2a. The first insulation film 14 is, for example, a silicon oxynitride film. The charge storage layer 15 is, for example, a silicon nitride film or a polycrystalline silicon layer. The second insulation film 16 is, for example, a silicon oxide film. The first semiconductor layer 17 is, for example, an amorphous silicon layer.

Figure 6A:
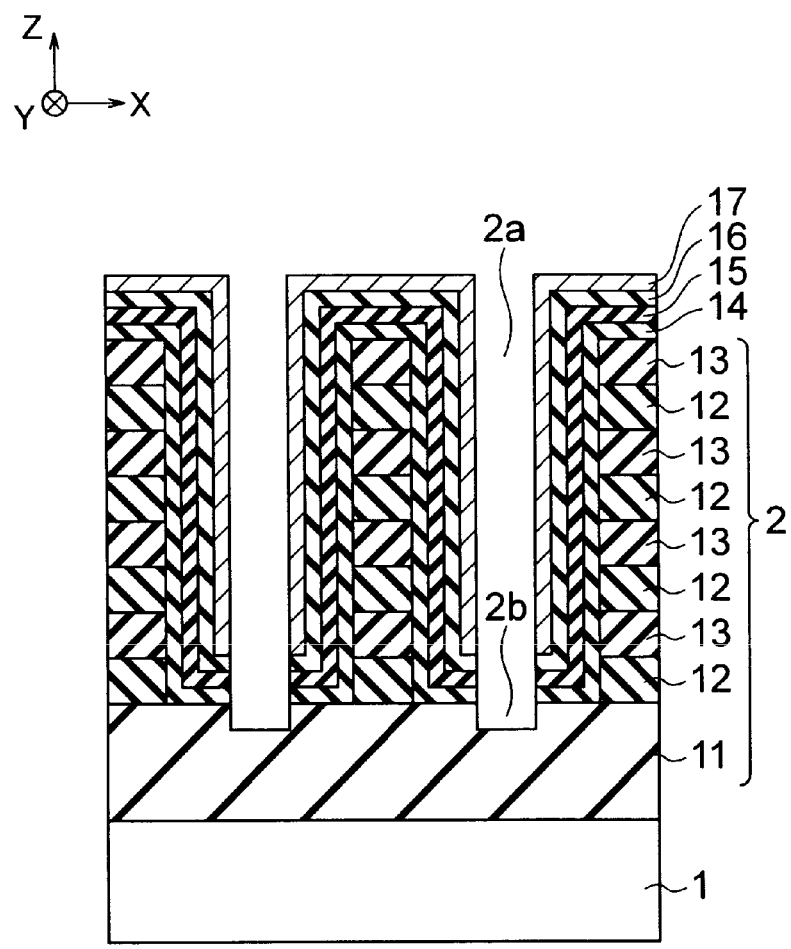
FIGS. 6A and 6B are sectional views illustrating the details of the method of manufacturing the semiconductor device according to the first embodiment.

Next, as shown in FIG. 6A, the first insulation film 14, the charge storage layer 15, the second insulation film 16, and the first semiconductor layer 17 are removed from the bottom surfaces of the openings 2a by lithography and etching. As a result, the bottom surfaces of the openings 2a are exposed again. By also etching the inter-layer insulation film 11, openings 2b are formed in the inter-layer insulation film 11.

Figure 6B:
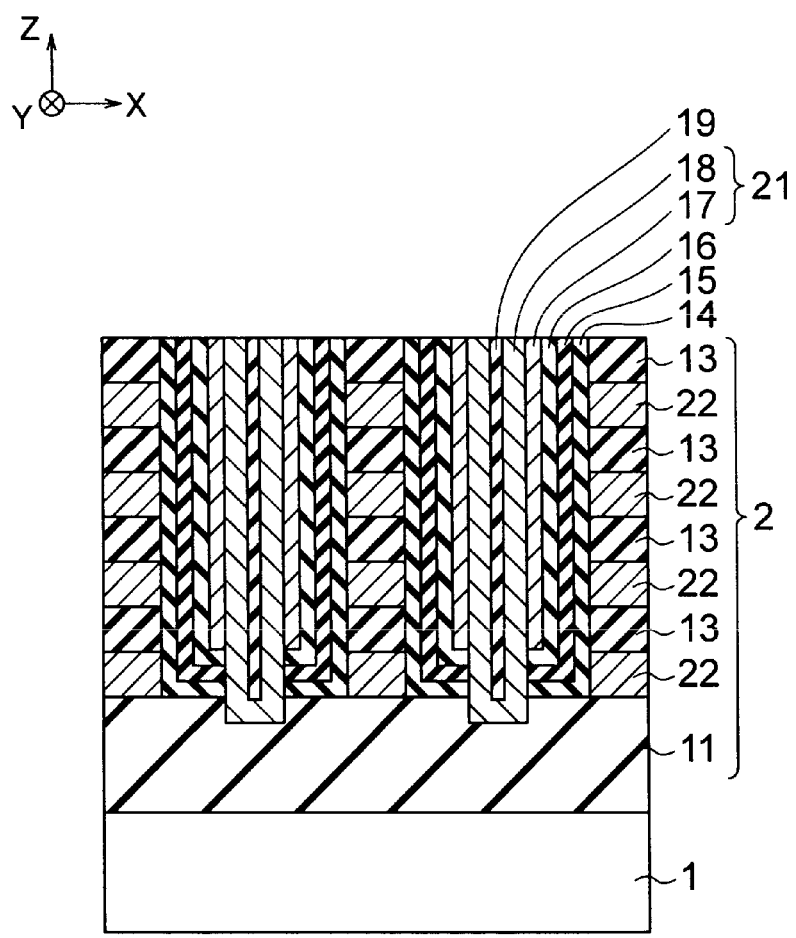

Next, as shown in FIG. 6B, a second semiconductor layer 18 and a third insulation film 19 are sequentially formed inside the openings 2a and 2b. As a result, the second semiconductor layer 18 is formed on the side surfaces and the bottom surfaces of the openings 2a and 2b with the first insulation film 14, the charge storage layer 15, the second insulation film 16, and the first semiconductor layer 17 interposed therebetween. The second semiconductor layer 18 is, for example, an amorphous silicon layer. The third insulation film 19 is, for example, a silicon oxide film. The first semiconductor layer 17 and the second semiconductor layer 18 are examples of semiconductor layers.

Next, the first insulation film 14, the charge storage layer 15, the second insulation film 16, the first semiconductor layer 17, the second semiconductor layer 18, and the third insulation film 19 are removed except for the openings 2a and 2b by chemical mechanical polishing (CMP) (see FIG. 6B). Next, the first semiconductor layer 17 and the second semiconductor layer 18 are crystallized by annealing to form a channel semiconductor layer 21 (see FIG. 6B). The channel semiconductor layer 21 is, for example, a monocrystalline silicon layer.

Next, the sacrificial layers 12 are substituted with a plurality of electrode layers 22 (see FIG. 6B). This substitution can be performed by forming openings (not illustrated) penetrating through the sacrificial layers 12 and the insulation layers 13, removing the sacrificial layers 12 using the openings by wet etching, and burying the electrode layers 22 in cavities where the sacrificial layers 12 are removed. Each electrode layer 22 includes a barrier metal layer such as a titanium nitride (TiN) layer and an electrode material layer such as a tungsten (W) layer.

In this way, a memory element of a 3-dimensional memory is formed in the opening 2a. Thereafter, various inter-layer insulation films, wiring layers, plug layers, and the like are formed on the substrate 1. As a result, the semiconductor device according to the embodiment is manufactured.

In this way, according to the embodiment, the openings 3a are formed in the first mask layer 3 using the first gas used to process the first mask layer 3 and the second gas containing the metal element, and the metal film 6 containing the metal element is formed on the side surfaces $S_2$ of the openings 3a. Accordingly, according to the embodiment, when the openings 3a are formed in the first mask layer 3, it is possible to suppress the recess of the side surfaces $S_2$ of the openings 3a.

Second Embodiment

FIGS. 7A to 10 are sectional views illustrating a method of manufacturing a semiconductor device according to a second embodiment.

First, the processes of FIGS. 1A to 2A are performed.

Figure 7A:
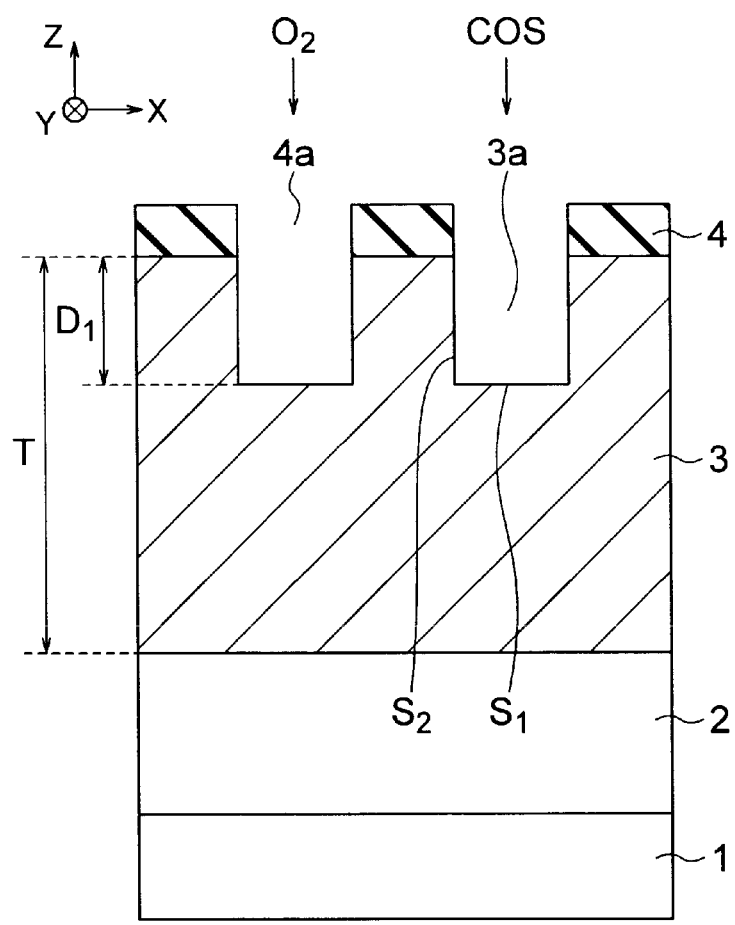
FIGS. 7A and 7B are sectional views illustrating a method of manufacturing a semiconductor device according to a second embodiment.

Next, as shown in FIG. 7A, a first process of processing the first mask layer 3 by the RIE is performed using the second mask layer 4 as a mask. As a result, opening 3a with a depth $D_1$ is formed in the first mask layer 3. The depth $D_1$ is, for example, ½ to ¼ of a thickness T of the first mask layer 3. The depth $D_1$ in FIG. 7A is ⅓ of the thickness T. The depth $D_1$ according to the embodiment is set so that a recess amount of the side surface $S_2$ of the opening 3a falls within an allowable range.

The RIE of the first process is performed using the first gas used to process the first mask layer 3. Examples of the first gas are the same as those of the first embodiment. The first gas according to the embodiment is a mixture gas that contains an oxygen ($O_2$) gas and a carbonyl sulfide (COS) gas. The first process according to the embodiment is performed using plasma of the mixture gas.

Figure 7B:
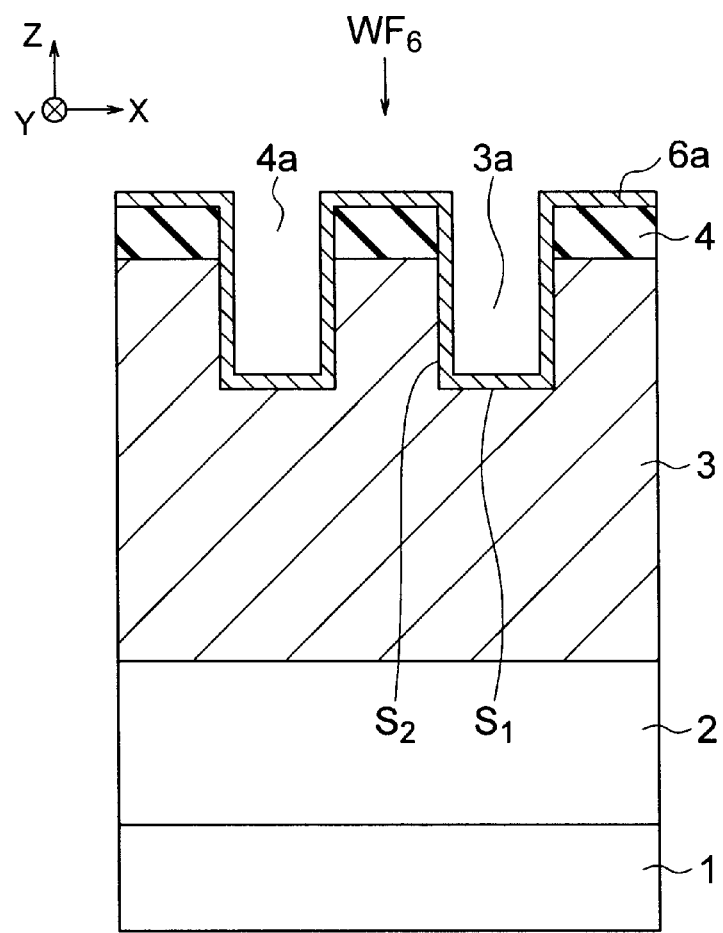

Next, as shown in FIG. 7B, a second process of forming the metal film 6a conformally is performed on the entire surface of the substrate 1. As a result, the metal film 6a is formed on the side surfaces $S_2$ and the bottom surfaces $S_1$ of the openings 3a.

The second process is performed in an RIE apparatus using the second gas containing the metal element. An example of the second gas is the same as those of the first embodiment. The second gas according to the embodiment is a tungsten hexafluoride ($WF_6$) gas. As a result, the metal film 6a becomes a tungsten film. The second process according to the embodiment is performed using plasma of the $WF_6$ gas.

Figure 8A:
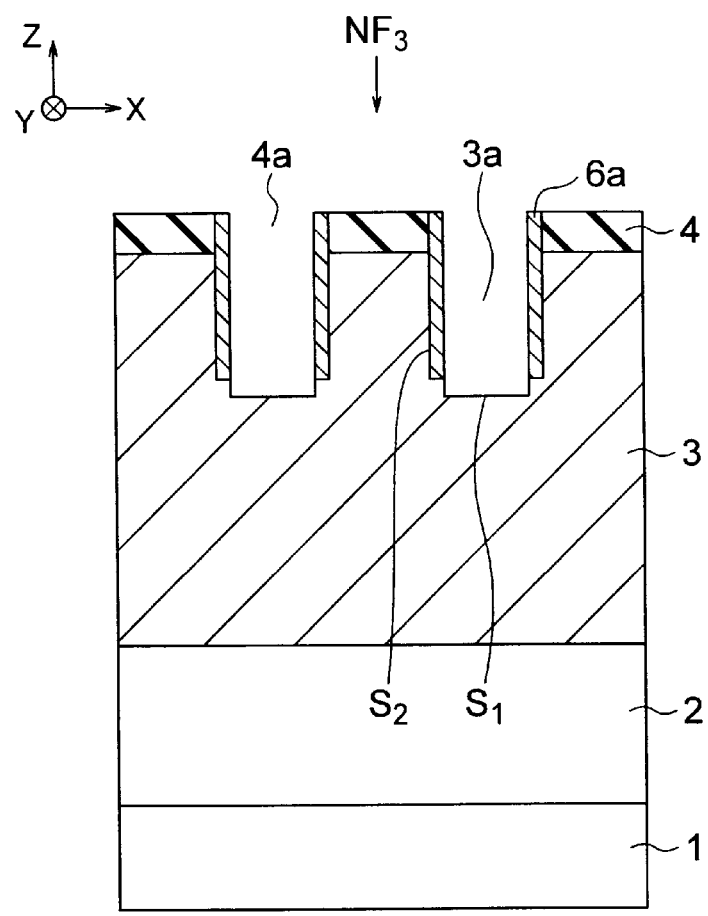
FIGS. 8A and 8B are sectional views illustrating the method of manufacturing the semiconductor device according to the second embodiment.

Next, as shown in FIG. 8A, a third process of processing the metal film 6a anisotropically by the RIE is performed. As a result, the metal film 6a is removed from the bottom surfaces $S_1$ of the openings 3a.

The RIE of the third process is performed using a third gas used to process the metal film 6a. The third gas according to the embodiment is a nitrogen trifluoride ($NF_3$) gas. The third process according to the embodiment is performed using plasma of the $NF_3$ gas.

The third gas may be another gas that contains fluorine or chlorine. Examples of the third gas include a sulfur hexafluoride ($SF_6$) gas, a chlorine ($Cl_2$) gas, a boron trichloride ($BCl_3$) gas, or mixture thereof.

In this way, the first to third processes are performed as one cycle. In the embodiment, by repeatedly performing the first to third processes by a plurality of cycles, it is possible to process the openings 3a to penetrate the first mask layer 3. At this time, in the embodiment, the first to third processes of the plurality of cycles are performed in the same RIE chamber. According to the embodiment, by repeatedly performing the first to third processes without taking out the substrate 1 from the RIE chamber, it is possible to perform the first to third processes in a short time. Hereinafter, the first to third processes after a second cycle will be described.

Figure 8B:
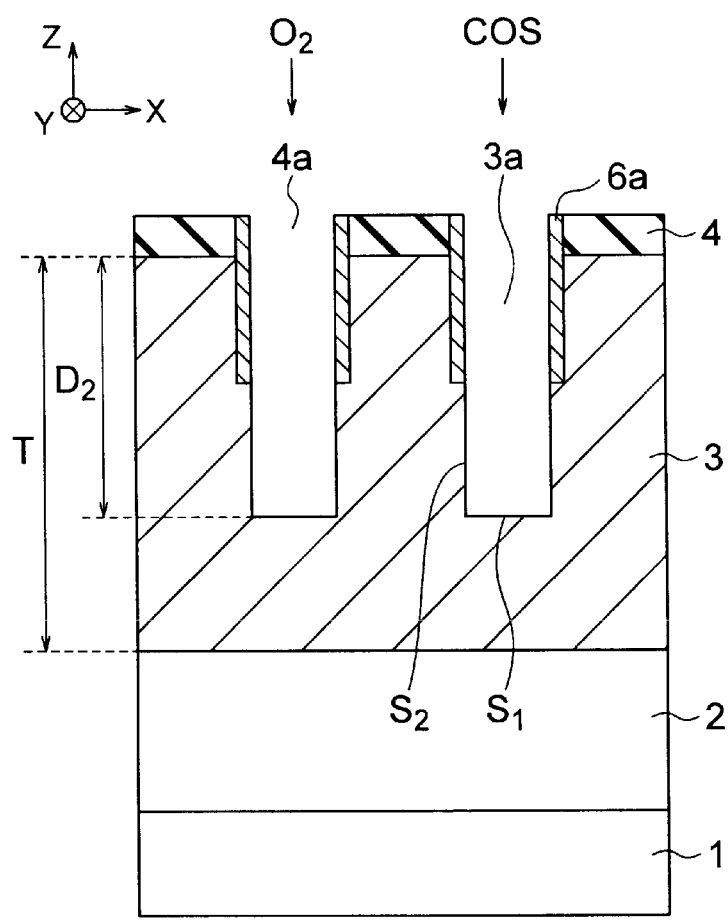

Next, as shown in FIG. 8B, the first process of the second cycle is performed. As a result, the openings 3a are processed so that the openings 3a have the depth $D_2$. A difference $D_2-D_1$ between the depths $D_1$ and $D_2$ is, for example, ½ to ¼ of the thickness T of the first mask layer 3. The difference $D_2-D_1$ in FIG. 8B is ⅓ of the thickness T. The depth $D_2$ according to the embodiment is set so that a recess amount of the side surface $S_2$ of the opening 3a falls within an allowable range.

Figure 9A:
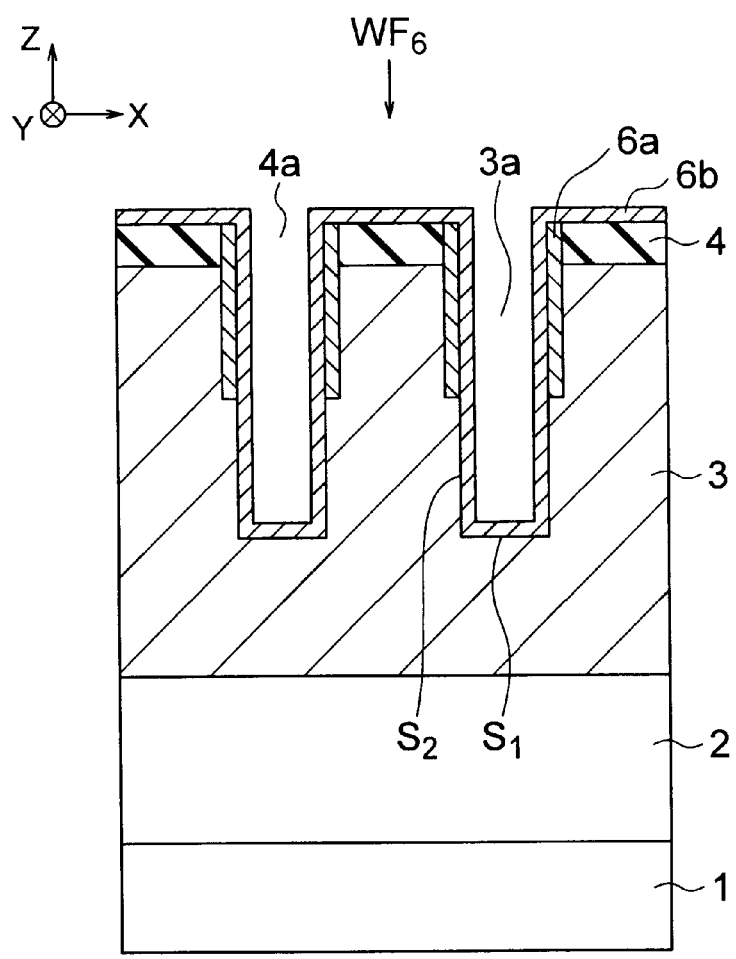
FIGS. 9A and 9B are sectional views illustrating the method of manufacturing the semiconductor device according to the second embodiment.

Next, as shown in FIG. 9A, the second process of the second cycle is performed. As a result, a metal film 6b is formed on the side surfaces $S_2$ and the bottom surfaces $S_1$ of the openings 3a. The metal film 6b according to the embodiment is a tungsten film as in the metal film 6a.

Figure 9B:
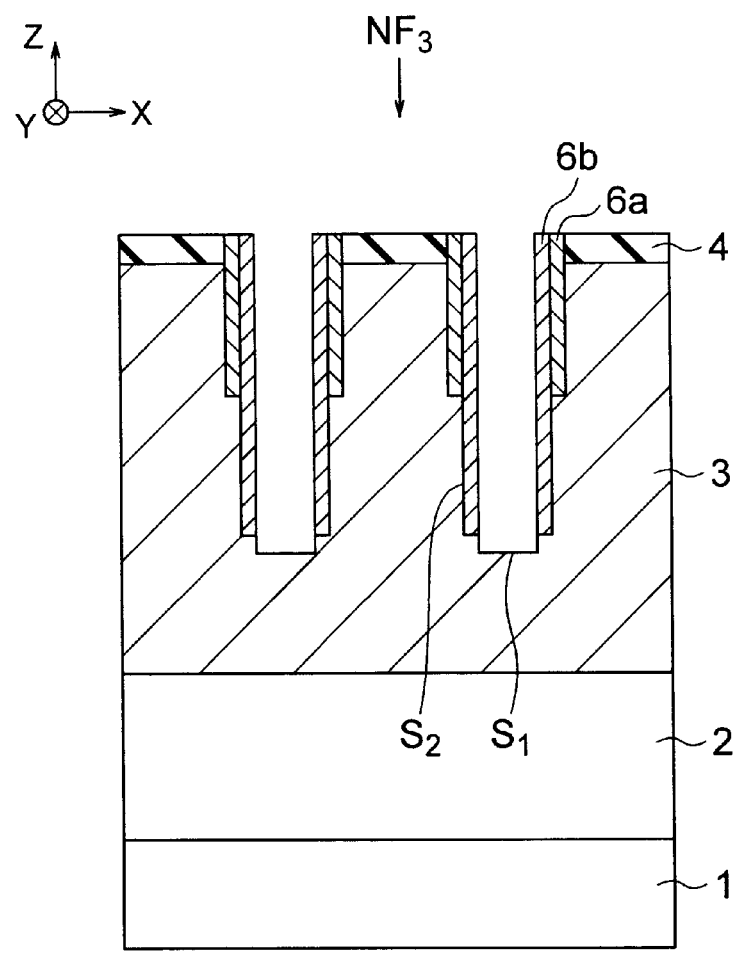

Next, as shown in FIG. 9B, a third process of the second cycle is performed. As a result, the metal film 6b is removed from the bottom surface $S_1$ of the opening 3a.

Figure 10:
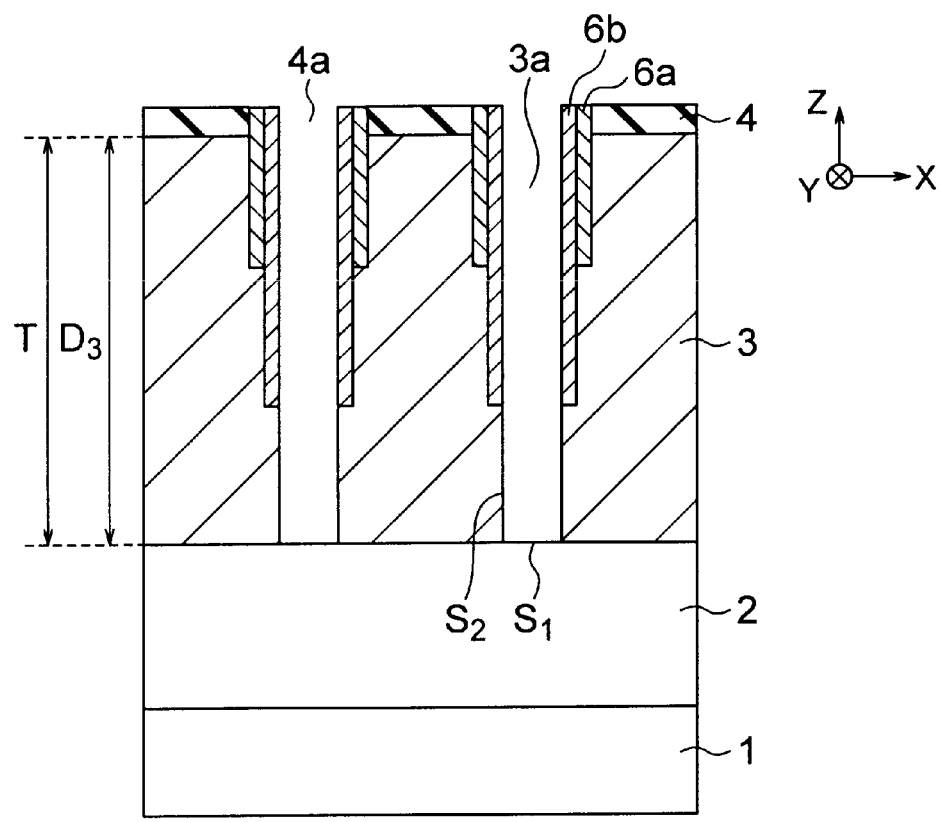
FIG. 10 is a sectional view illustrating the method of manufacturing the semiconductor device according to the second embodiment.

Next, as shown in FIG. 10, the first process of a third cycle is performed. As a result, the openings 3a are processed so that the openings 3a have the depth $D_3$. A difference $D_3-D_2$ between the depths $D_2$ and $D_3$ is ½ to ¼ of the thickness T of the first mask layer 3. The difference $D_3-D_2$ in FIG. 10 is ⅓ of the thickness T. The depth $D_3$ according to the embodiment is set so that an amount of recess (erosion) of the side surface $S_2$ of the opening 3a falls within an allowable range.

In this way, the openings 3a penetrating through the first mask layer 3 are formed. An example of an aspect ratio of the opening 3a is equal to or greater than 20 (for example, 20 to 30). In the embodiment, the first to third processes are repeatedly performed during two cycles, but the first to third processes may be performed repeatedly at three or more cycles.

Thereafter, the openings 2a are formed in the processing layer 2 below the openings 3a to form memory elements of the 3-dimensional memories in the openings 2a (see FIG. 4 to FIG. 5B). Further, various inter-layer insulation films, wiring layers, plug layers, and the like are formed on the substrate 1. As a result, the semiconductor device according to the embodiment is manufactured.

As described in the first embodiment, when a thick metal film is attached to the bottom surface $S_1$ of the opening 3a, the etching of the first mask layer 3 is obstructed due to the metal film. Accordingly, in the second embodiment, the metal film is removed from the bottom surface $S_1$ of the opening 3a through the third process. Accordingly, the opening 3a can continuously be processed until the opening 3a penetrates through the first mask layer 3.

In the embodiment, the flow rate of the second gas may be set to be equal to or less than 10 sccm or may be set to be equal to or greater than 10 sccm. When the flow rate of the second gas is set to be equal to or greater than 10 sccm, the second process can be performed in a short process time.

Figure 11:
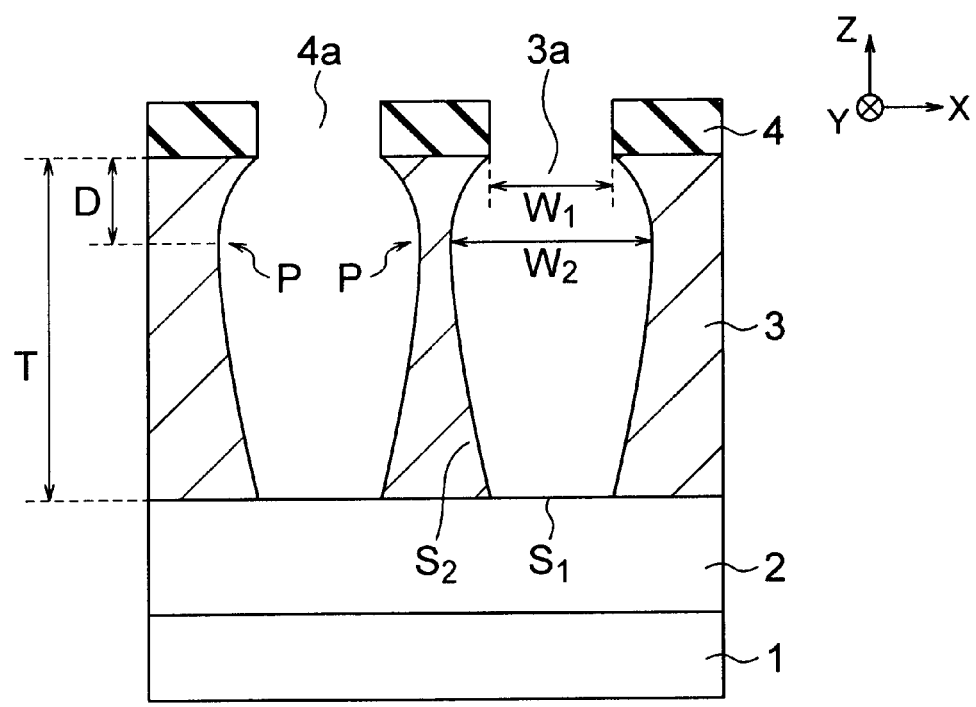
FIG. 11 is a sectional view illustrating a method of manufacturing a semiconductor device according to a comparative example to the second embodiment.

FIG. 11 is a sectional view illustrating a method of manufacturing a semiconductor device according to a comparative example of the second embodiment.

FIG. 11 illustrates a case in which only the first process is performed to form the openings 3a. In this case, when the openings 3a are formed, the side surfaces $S_2$ of the openings 3a are largely recessed or eroded. Reference sign W denotes the width of the upper end of the opening 3a. Reference sign W' denotes the width of a broadest portion P of the opening 3a. Reference sign D denotes the depth of the broadest portion P. In the comparative example, a difference between the widths W and W' may increase. In contrast, according to the embodiment, the difference between the widths W and W' can be configured to be small.

In the process depicted in FIG. 11, the broadest portion P typically forms at a depth of about ¼ of the thickness T of the first mask layer 3. That is, the depth D of the broadest portion P is at about ¼ of the thickness T. Therefore, in the second embodiment described herein, each etching cycle of the first mask layer 3 extends the depth of the opening 3a by ½ to ¼ of the thickness T. Specifically, values of $D_1$, $D_2-D_1$, and $D_3-D_2$ are set to be ½ to ¼ of the thickness T. Accordingly, it is possible to effectively suppress the recess of the side surface $S_2$ because etching is paused when the etch depth reaches the point of maximum lateral etching, and the sidewalls $S_2$ are covered by an etch resistant material before etching resumes.

Figure 12A:
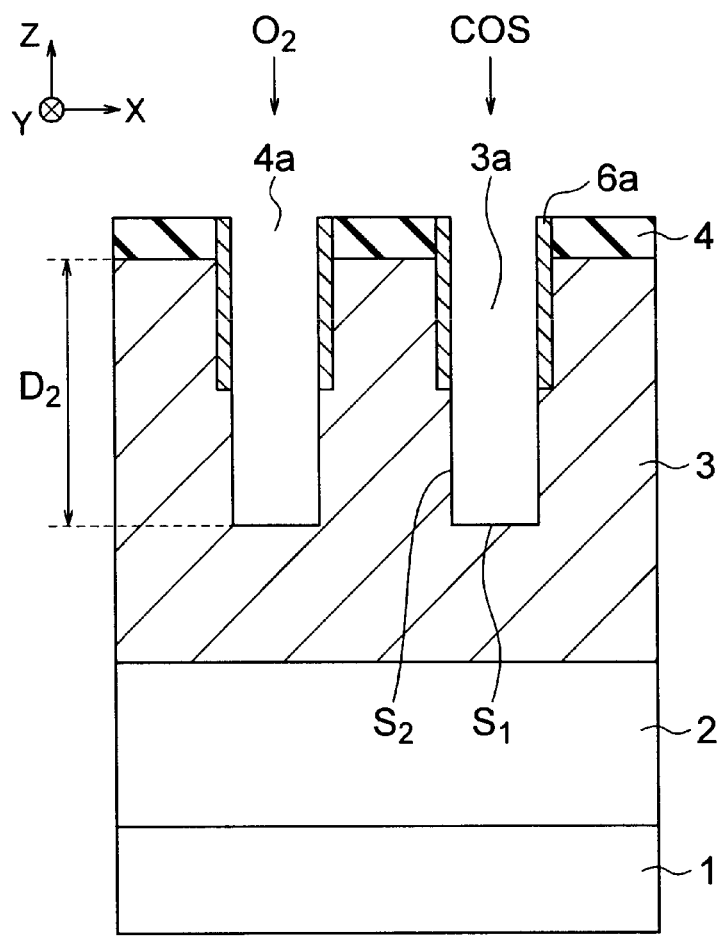
FIGS. 12A and 12B are sectional views illustrating a method of manufacturing a semiconductor device according to a modification example of the second embodiment.
Figure 12B:
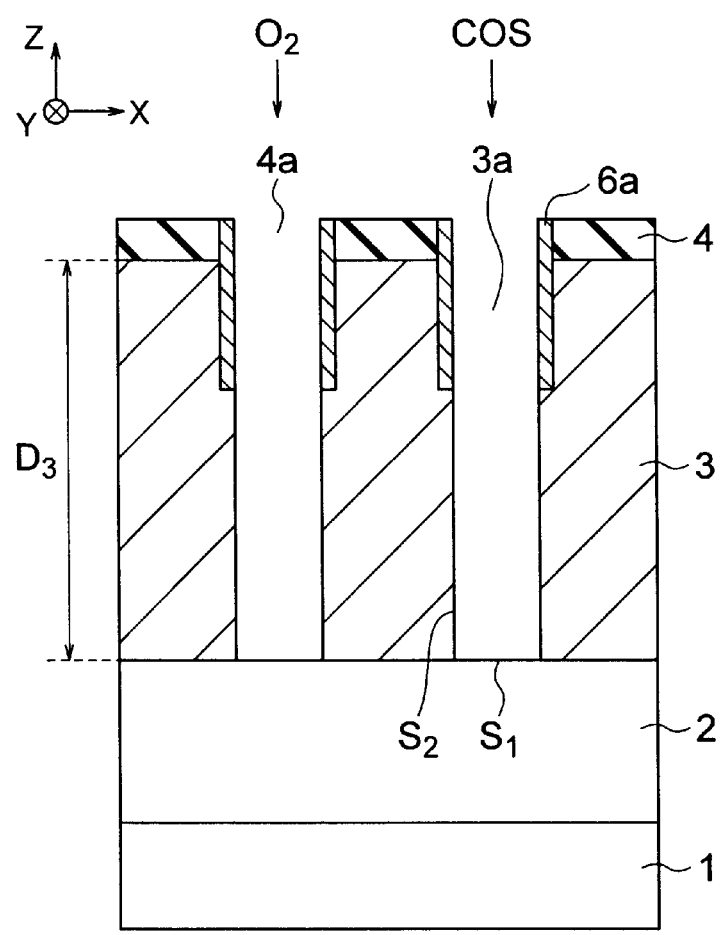

FIGS. 12A and 12B are sectional views illustrating a method of manufacturing a semiconductor device according to a modification example of the second embodiment.

FIG. 12A illustrates the process of FIG. 8B. That is, FIG. 12A illustrates the first process of the second cycle, wherein depth of the etched opening 3a is extended after formation of the layer 6a covering the sidewall $S_2$. In the modification example, after the first to third processes of the first cycle are performed, only the first process of the second cycle is performed. Accordingly, as shown in FIG. 12B, the openings 3a penetrating through the first mask layer 3 are formed.

As described above, the broadest portion P of the opening 3a (shown in FIG. 11) typically forms at the depth of ¼ of the thickness T of the first mask layer 3 (corresponding to the depth of the metal film 6a). According to the modification example, the openings 3a can be formed with minimal lateral etching by omitting the second and third processes after the second cycle and performing only the first process in the third cycle in a short time period, while protecting the upper portion of the sidewall $S_2$ using the metal film 6a, as shown in FIG. 12B. Accordingly, in the modification example, the depth $D_1$ is preferably set to be ½ to ¼ of the thickness T.

As described above, in the embodiment, the openings 3a penetrating through the first mask layer 3 are formed during the first process of processing the first mask layer 3, the second process of forming the metal film 6a conformally, and the third process of processing the metal film 6a anisotropically. Accordingly, when the opening 3a is formed, the erosion of the side surface $S_2$ of the opening 3a can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

forming a first film on a substrate;

forming a second film on the first film;
flowing a mixture gas to form a first opening in the second film using plasma of the mixture gas that includes a first gas and a second gas containing a metal element;
forming a third film containing the metal element on a side surface of the first opening; and
forming a second opening in the first film below the first opening using the second film as a mask,
wherein the second film contains carbon,
wherein the first gas includes at least one of an oxygen ($O_2$) gas, a hydrogen ($H_2$) gas, and a nitrogen ($N_2$) gas,
wherein the second gas includes at least one of a tungsten hexafluoride ($WF_6$) gas, a molybdenum hexafluoride ($MoF_6$) gas, a rhenium hexafluoride ($ReF_6$) gas, a platinum hexafluoride ($PtF_6$) gas, an iridium hexafluoride ($IrF_6$) gas, a titanium tetrachloride ($TiCl_4$) gas, a ruthenium tetroxide ($RuO_4$) gas, and a trimethylaluminum (($CH_3)_3Al$) gas, and
wherein a ratio of a flow rate of the second gas in the mixture gas to a total flow rate of the first gas and the second gas in the mixture gas is equal to or less than 5 percent.

2. The method of manufacturing the semiconductor device according to claim 1,
wherein the first film includes a plurality of first layers alternating with a plurality of second layers, and
wherein the second opening is formed in each of the plurality of first layers and each of the plurality of second layers.

3. The method of manufacturing the semiconductor device according to claim 2, further comprising:
forming a first insulation film, a charge storage layer, a second insulation film, and a semiconductor layer in the second opening,
wherein each of the first layers are substituted with a plurality of electrode layers after the semiconductor layer is formed, and
wherein the each of the second layers comprise an insulation layer.

4. The method according to claim 1,
wherein the flow rate of the second gas in the mixture gas is 5 sccm.

5. A method of manufacturing a semiconductor device, comprising:
forming a first film on a substrate;
forming a second film on the first film;
forming a first opening in the second film using plasma of a mixture gas of a first gas and second gas by simultaneously using the first gas to form the first opening in the second film and the second gas containing a metal element to form a third film containing the metal element on a side surface of the first opening; and
forming a second opening in the first film below the first opening using the second film as a mask
wherein the second film contains carbon,
wherein the first gas includes at least one of an oxygen ($O_2$) gas, a hydrogen ($H_2$) gas, and a nitrogen ($N_2$) gas,
wherein the second gas includes at least one of a tungsten hexafluoride ($WF_6$) gas, a molybdenum hexafluoride ($MoF_6$) gas, a rhenium hexafluoride ($ReF_6$) gas, a platinum hexafluoride ($PtF_6$) gas, an iridium hexafluoride ($IrF_6$) gas, a titanium tetrachloride ($TiCl_4$) gas, a ruthenium tetroxide ($RuO_4$) gas, and a trimethylaluminum (($CH_3)_3Al$) gas, and
wherein a ratio of a flow rate of the second gas in the mixture gas to a total flow rate of the first gas and the second gas in the mixture gas is equal to or less than 5 percent.

6. The method of manufacturing the semiconductor device according to claim 5,
wherein the first film includes a plurality of first layers alternating with a plurality of second layers, and
wherein the second opening is formed in each of the plurality of first layers and each of the plurality of second layers.

7. The method of manufacturing the semiconductor device according to claim 6, further comprising:
forming a first insulation film, a charge storage layer, a second insulation film, and a semiconductor layer in the second opening,
wherein each of the first layers are substituted with a plurality of electrode layers after the semiconductor layer is formed, and
wherein the each of the second layers comprise an insulation layer.

8. The method according to claim 5,
wherein the flow rate of the second gas in the mixture gas is 5 sccm.

* * * * *